US012117821B2

(12) United States Patent
Chakravarthy et al.

(10) Patent No.: US 12,117,821 B2
(45) Date of Patent: Oct. 15, 2024

(54) DEVICE AND METHOD FOR VERIFICATION OF FIELD DEVICES

(71) Applicant: ABB Schweiz AG, Baden (CH)

(72) Inventors: Suhas Chakravarthy, Bangalore (IN); Jutty Prakash Dinesh, Auckland (NZ); Shanthala Kamath, Bangalore (IN); David Lincoln, Glousestershire (GB); Mini T T, Bangalore (IN)

(73) Assignee: ABB Schweiz AG, Baden (CH)

( * ) Notice: Subject to any disclaimer, the term of this patent is extended or adjusted under 35 U.S.C. 154(b) by 612 days.

(21) Appl. No.: 16/474,057

(22) PCT Filed: Sep. 28, 2017

(86) PCT No.: PCT/IB2017/055956
§ 371 (c)(1),
(2) Date: Jun. 26, 2019

(87) PCT Pub. No.: WO2018/122637
PCT Pub. Date: Jul. 5, 2018

(65) Prior Publication Data
US 2019/0369610 A1    Dec. 5, 2019

(30) Foreign Application Priority Data

Dec. 28, 2016  (IN) .............................. 201641044553

(51) Int. Cl.
*G05B 23/02*  (2006.01)
*G05B 19/042*  (2006.01)

(52) U.S. Cl.
CPC ..... *G05B 23/0235* (2013.01); *G05B 19/0421* (2013.01); *G05B 2219/25428* (2013.01)

(58) Field of Classification Search
CPC ............ G05B 23/0235; G05B 23/0256; G05B 19/0421; G05B 19/042; G05B 2219/25428; G05B 2219/33331; G01R 31/2829
See application file for complete search history.

(56) References Cited

U.S. PATENT DOCUMENTS 10,386,824 B2 *  8/2019  Jundt .................. G05B 19/4185
10,459,418 B2 * 10/2019  Peluso ............... G05B 19/0426
(Continued)

FOREIGN PATENT DOCUMENTS

| DE | 102010044184 A1 * | 5/2012 | ......... G05B 19/0428 |
| DE | 102011075764 A1 * | 11/2012 | ......... G05B 19/0428 |
| WO | 2008048501 A2 | 4/2008 | |

OTHER PUBLICATIONS

O'Connor, Matthew, Bruce Geddes, and Sean Kelley. "Guidance and methodologies for managing digital instrumentation and control obsolescence." Journal of Nuclear Engineering and Radiation Science 2, No. 4 (Oct. 2016): 041010 (Year: 2016).*
(Continued)

*Primary Examiner* — Douglas Kay
(74) *Attorney, Agent, or Firm* — Leydig, Voit & Mayer, Ltd.

(57) ABSTRACT

The present invention discloses a verification device for verifying a field device. The verification device comprises a repository and verification module. The repository comprises a plurality of verification definition data sets, each verification definition data set associated with a type of field device and comprises one or more sets of threshold values of one or more corresponding operational parameters for the corresponding type of field device. The verification module obtains a corresponding verification definition data set associated with the field device under verification; measures values of the operational parameters of the field device
(Continued)

under verification in accordance with the corresponding verification definition data set and compares the measured values of the operational parameters with corresponding threshold values of the operational parameters from a set of threshold values of the operational parameters from the corresponding verification definition data set.

6 Claims, 5 Drawing Sheets

(56) References Cited

U.S. PATENT DOCUMENTS

| | | | | |
|---|---|---|---|---|
| 10,698,388 | B2* | 6/2020 | Ishikawa | G05B 19/4184 |
| 2004/0199351 | A1* | 10/2004 | Ott | G05B 23/0256 |
| | | | | 714/E11.169 |
| 2007/0154228 | A1* | 7/2007 | Chan | G03G 15/0865 |
| | | | | 399/12 |
| 2007/0250180 | A1* | 10/2007 | Bump | G05B 19/41845 |
| | | | | 700/1 |
| 2014/0046618 | A1* | 2/2014 | Arunachalam | G05B 19/0428 |
| | | | | 702/127 |
| 2014/0257529 | A1* | 9/2014 | Dicaire | G05B 23/0267 |
| | | | | 700/79 |
| 2017/0160727 | A1* | 6/2017 | Ishikawa | G05B 19/4184 |
| 2018/0024519 | A1* | 1/2018 | Peluso | G05B 19/4065 |
| | | | | 340/679 |
| 2018/0217580 | A1* | 8/2018 | Jundt | H04L 41/0806 |
| 2018/0231959 | A1* | 8/2018 | Jundt | H04L 41/0806 |

OTHER PUBLICATIONS

Carr, Nicholas B. "Development of a tailored methodology and forensic toolkit for industrial control systems incident response." PhD diss., Monterey, California: Naval Postgraduate School, 2014 (Year: 2014).*

International Search Report for PCT/IB2017/055956 dated Nov. 28, 2017, 3 pages.

International Preliminary Report on Patentability for PCT/IB2017/055956 dated Jul. 2, 2019, 8 pages.

Search Report for IN 201641044553 dated Mar. 23, 2020, 6 pages.

* cited by examiner

DEVICE AND METHOD FOR VERIFICATION OF FIELD DEVICES

CROSS-REFERENCE TO RELATED APPLICATIONS

This application is a U.S. national stage of International Application Serial No. PCT/IB2017/055956, filed Sep. 28, 2017, which claims priority to Indian Patent Application No. 201641044553, filed Dec. 28, 2016. The entire disclosures of both of the foregoing applications are incorporated herein by reference.

FIELD OF TECHNOLOGY

The disclosure relates generally to field devices, and more particularly to verification of a plurality of installed field devices used in industrial automation.

BACKGROUND

One of the key aspects of industrial automation systems, or factory automation systems is the industrial measurement devices. The industrial measurement devices are used in process industries, mainly to measure the values of one or more parameters—temperature, pressure, flow, level, force and the like. The measurement devices are critical for running of plant and machinery in industrial automation systems. Moreover, such measurement devices are important for running of plant and machinery and improper functioning of such devices can result in poor control of industrial systems. Because of this, it is very much important to verify the functionality of such measurement devices at regular intervals of time.

Currently, verification devices are available to verify the functioning of particular measurement devices. These verification devices are always tied to a specific measurement device. Hence, there is one verification device for a specific measurement device type resulting in multiple verification devices for several measurement devices types. The multiple verification devices pose operational issues as plant maintenance engineers need to purchase and maintain multiple verification devices. The plant maintenance engineers and service engineers need to carry multiple verification devices to the field, which further poses various challenges.

The separate product life cycle management for each of these verification devices leads to higher overheads and development cost further leading to complexity in managing different products. The use of several verification devices is also often confusing for sales and service personnel.

Additionally, the capital and operational expenses involved in acquiring and maintaining different verification devices is high. The operators of these verification devices need to be trained for each of the several verification devices. Moreover, the operators have to maintain the setup, configuration, accessories, etc., for each of these verification devices. Most importantly, physically carrying many such verification devices to the place where the devices are installed is also challenging.

SUMMARY

In order to solve at least some of the above mentioned problems, there exists a need for a verification device and a verification method that allows verification of a plurality of types of measurement devices installed in the field.

Exemplary embodiments provide a single verification device for verification of a plurality of field devices, used in industrial automation and factory automation systems.

Briefly, according to an exemplary embodiment, a verification device for verifying a plurality of types of installed field devices is provided. The verification device comprises an adapter configured to operatively connect the verification device to a field device under verification. The verification device also comprises a repository comprising a plurality of verification definition data sets. Each of the verification definition data sets is associated with a type of field device from the plurality of types of field devices. The verification definition data sets comprises one or more sets of threshold values of one or more corresponding operational parameters for a corresponding type of field device.

In addition, the verification device comprises a verification module. The verification module, obtains from the repository, a corresponding verification definition data set associated with the field device under verification, based on a device type identifier of the field device, and then measures one or more values of one or more operational parameters of the field device under verification in accordance with the corresponding verification definition data set. Then, the verification module compares the measured values of the one or more operational parameters with corresponding threshold values of the one or more operational parameters from a set of threshold values of the one or more operational parameters from the corresponding verification definition data set, and determines a condition of the field device under verification based on the comparison.

In an embodiment, the corresponding verification definition data set of the field device under verification, comprises a first set of one or more threshold values of the corresponding operational parameters and a second set of one or more threshold values of the corresponding operational parameters. The threshold values of the first set are based on reference values of the one or more operational parameter at the production of the field device under verification. The threshold values of the second set are based on one or more values of the operational parameters measured upon installation of the field device under verification at the process plant.

In an embodiment, each verification definition data set further comprises one or more values of electrical excitation parameters to be applied to a corresponding type of field device. The verification module is configured to excite the field device under verification prior to measurement of one or more values of operational parameters of the field device under verification, by providing electrical excitation in accordance with the one or more values of the electrical excitation parameters of the corresponding verification definition data set associated with the field device under verification.

A method for verifying in situ, an installed field device is also disclosed herein. The summary above is illustrative only and is not intended to be in any way limiting. Further aspects, exemplary embodiments, and features will become apparent by reference to the drawings and the following detailed description.

BRIEF DESCRIPTION OF THE FIGURES

These and other features, aspects, and advantages of the exemplary embodiments can be better understood when the following detailed description is read with reference to the accompanying drawings in which like characters represent like parts throughout the drawings, wherein.

DETAILED DESCRIPTION

For the purpose of promoting an understanding of the principles of the invention, reference will now be made to the embodiments illustrated in the figures and specific language will be used to describe the same. It will nevertheless be understood that no limitation of the scope of the invention is thereby intended, such alterations and further modifications in the illustrated system, and such further applications of the principles of the invention as illustrated therein being contemplated as would normally occur to one skilled in the art to which the invention relates.

It will be understood by those skilled in the art that the foregoing general description and the following detailed description are exemplary and explanatory of the invention and are not intended to be restrictive thereof.

At least one exemplary embodiment is generally directed towards a verification device for verifying a plurality of types of measurement devices installed in one or more fields. For conciseness; the verification device disclosed herein facilitates the verification in situ of a plurality of types of field devices.

In one or more embodiments the present invention discloses a verification device for verifying in situ a plurality of types of installed field devices. The verification device comprises an adapter configured to operatively connect the verification device to a field device under verification. The verification device also comprises a repository comprising a plurality of verification definition data sets associated with the field device under verification. The verification definition data sets comprise data that define the verification to be performed on the field device under verification. In addition, the verification device comprises a verification module configured for retrieving/obtaining from the repository the verification definition data set associated with the field device under verification and performing verification of the field device under verification on the basis of the corresponding verification definition data set.

The word 'field device' and 'measurement device' used in the description refer to the same entity. The adapter measures the field device operational parameters. Examples of operational parameters comprise, but are not limited to electrical resistance, reactance, line to ground resistance, or combinations thereof. The measured values of the device operational parameters are then used to verify the operation of installed field device.

In one exemplary embodiment, the field device to be verified may be an electromagnetic flow meter. The verification of flow meter is necessary to confirm the long-term sensor or transmitter stability. In one embodiment, the verification of the electromagnetic flow meter may implicate electrical excitations or simulations that does not involve actual flow or process comparisons under flowing conditions.

The verification of the electromagnetic flow meter illustrates several test points and the suitability of the meter to remain in process with a degree of confidence that it is working with little or no deviation from the original installation. To verify the working of the electromagnetic flow meter, the adapter of verification device is connected to the electromagnetic flow meter. The steps involved for specific device verification comprises selection of the field device to be verified. The selection of field device (electromagnetic flow meter) to be verified may be done based on the device type identifier of the field device to be verified, provided either automatically by the field device, or by user entry. The type of field device to be verified is identified based on the device type identifier, upon selection either manually or automatically.

Accordingly, based on the device type identifier, the verification device identifies that the device to be verified is an electromagnetic flow meter. Based on the identified field device (i.e. the magnetic flow meter) to be verified, the verification module obtains from the repository the corresponding verification definition data set associated with the electromagnetic flow meter. Then, according to the corresponding verification definition data set, the verification device measures the values of the operational parameters of the electromagnetic flowmeter and compares the measured values with the threshold values specified in the verification definition data set to determine the condition of the electromagnetic flowmeter.

In addition to the illustrative aspects, exemplary embodiments, and features described above, further aspects, exemplary embodiments of the present disclosure will become apparent by reference to the drawings and the following detailed description.

Figure 1:
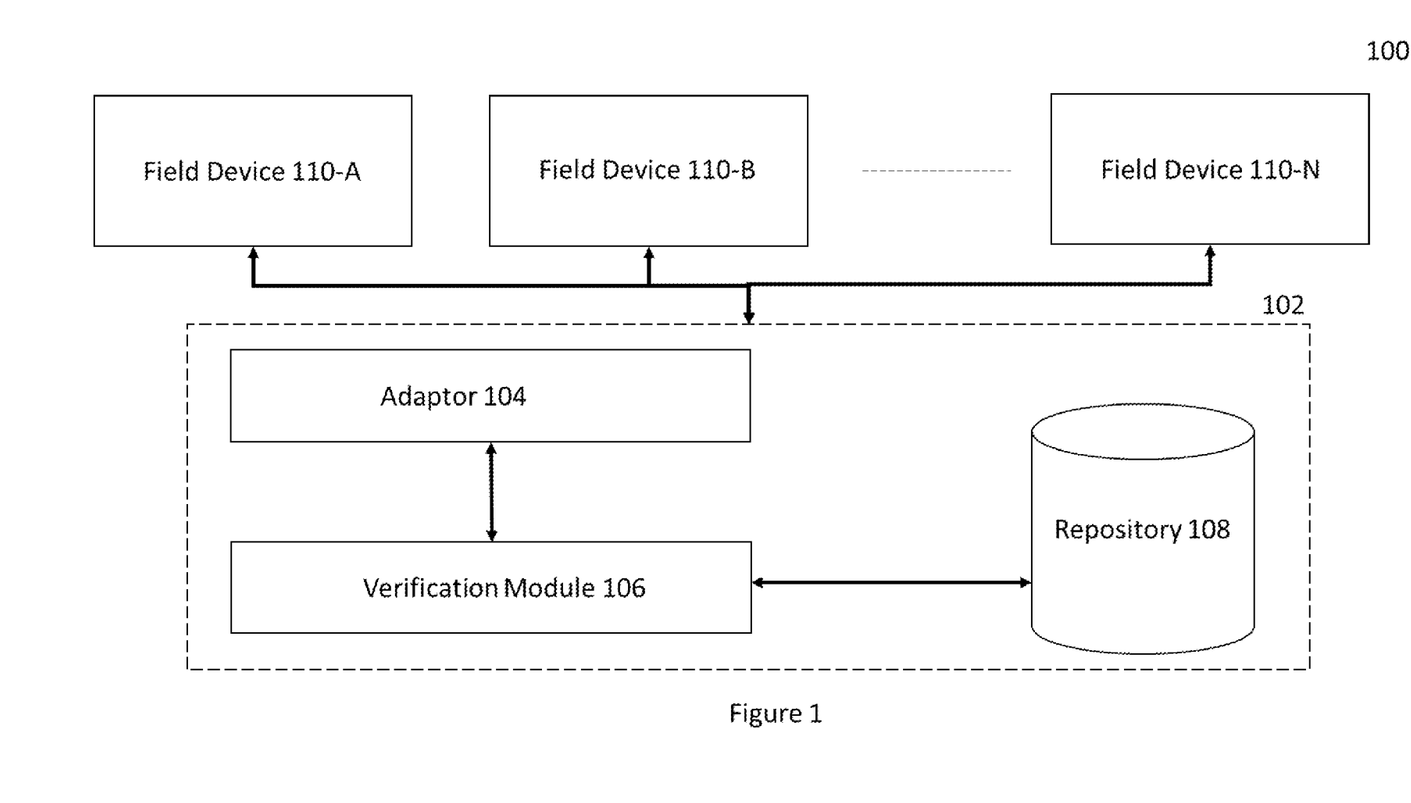
FIG. 1 is a block diagram of one embodiment of a verification system configured for verifying in situ, a plurality of types of installed field devices, according to an embodiment of the present disclosure.

FIG. 1 is a block diagram of a verification system 100 configured for verifying a plurality of types of field devices, according to one or more embodiments of the present disclosure. In particular, the FIG. 1 comprises a verification device 102 and a plurality of types of installed field devices 110-A through 110-N. The verification device 102 comprises an adapter 104, a verification module 106 and a repository 108. Each component is described in further details below.

In one embodiment, the verification device 102 is configured for verifying a plurality of types of field devices 110-A through 110-N. The field device 110-A through 110-N hereafter collectively referred as the field device 110 are industrial measurement devices or measurement instruments. The field devices 110 may be used in process industries mainly to measure a plurality of process parameters such as temperature, pressure, flow, level, force, liquid conductivity, pH and the like.

The verification device 102 comprises the adapter 104. The adapter 104 is configured to operatively connect the verification device 102 to a field device (e.g. 110-A) under verification. The adapter 104 along with the verification module 106, is configured for performing measurements of device operational parameters which may be used to verify the functioning of field device under verification. In one embodiment, the adapter 104 is configured to electrically connect the verification device 102 to the selected field devices (110) for measuring the value(s) of parameters like electrical resistance, voltage, reactance, line to ground resistance, or combinations thereof.

The repository 108 comprises a plurality of verification definition data sets. A plurality of verification definition data sets is associated with a plurality of types of field devices. At least one corresponding verification definition data set from the verification definition data sets stored in the repository 108, is associated with the field device under verification (also referred to as field device under test) and accordingly, used by the verification device for the verification of the field device under verification. The verification definition data set includes the one or more operational parameters of the field device which are to be measured along with the corresponding threshold or reference values of the one or more operational parameters against which the measured values of the operational parameters of the field device are to be compared against.

In one embodiment, each verification definition data set comprises a first set of one or more threshold values of corresponding operational parameters (also referred to as device fingerprint data) and a second set of one or more threshold values of the corresponding operational parameters (also referred to as application fingerprint data). In one exemplary embodiment, the device fingerprint data comprises values of the operational parameters measured prior to shipping the field device under verification. In another exemplary embodiment, the application fingerprint data comprise values of the operational parameters of the field device under verification, after installing and commissioning the field device in the process plant.

FIG. 1 illustrates the field device 110-A as a selected device (as shown by reference numeral 112) for verifying its accurate operation and functioning. In one exemplary embodiment, the user may select the field device 110-A to be verified by providing the device type identifier of the field device 110-A. In another embodiment, the selection of field device 110-A may be done automatically, based the device type identifier of the field device 110-A.

The verification module 106 (including one or more processors) present in the verification device 102 is configured for retrieving/obtaining from the repository 108 (stored on a memory module) the verification definition data set associated with the field device under verification (110-A) based on the device type identifier provided.

In one exemplary embodiment, the verification module 106 is configured to obtain the device fingerprint data and the application fingerprint data associated with the selected field device 110-A. The device fingerprint data (i.e. first set of one or more threshold values of corresponding operational parameters) comprises parameter values measured prior to shipping the field device under verification. For example, the device fingerprint data comprises the parameters values that corresponds to values indicating post manufacturing device parameters of the field device under verification. The device fingerprint data of the field device under verification are the values of the parameters as supplied. In addition, the device fingerprint data also comprises information related to device characteristics and may be any one of "device tag", "device model, "device ID", "manufacturer/vendor ID" and "revision No". The successful retrieval of at least one device fingerprint data confirms that the verification module 106 is connected to field device 110-A under verification.

The application fingerprint data (i.e. the second set of one or more threshold values of corresponding operational parameters) of the field device under verification are the values of the parameters as measured after installing and commissioning the measurement device. For example, the application fingerprint data of the field device under verification can be generated and stored in repository 108 of the verification device 102 either at commissioning or during first verification.

In one embodiment, the verification module 106 along with the adapter 104 measure one or more values of one or more operational parameters of the field device under verification in accordance with the corresponding verification definition dataset. For example, the operational parameters measured may include voltage, pulse, reactance, capacitance or combinations thereof.

The verification module 106 is then configured for comparing the measured values with the corresponding threshold values of the one or more parameters of the field device under verification. Lastly, the verification module 106 determines a condition of the field device based on the comparison. In an embodiment, the verification module 106 comprises a verification result output module (not shown) for outputting a result of the verification.

In one embodiment, the verification module 106 is configured for updating the threshold values of the one or more operational parameters of the field device under verification, each time a verification is performed. The updated threshold values of the one or more parameters are stored in the verification definition data set associated with the field device under verification.

Figure 2:
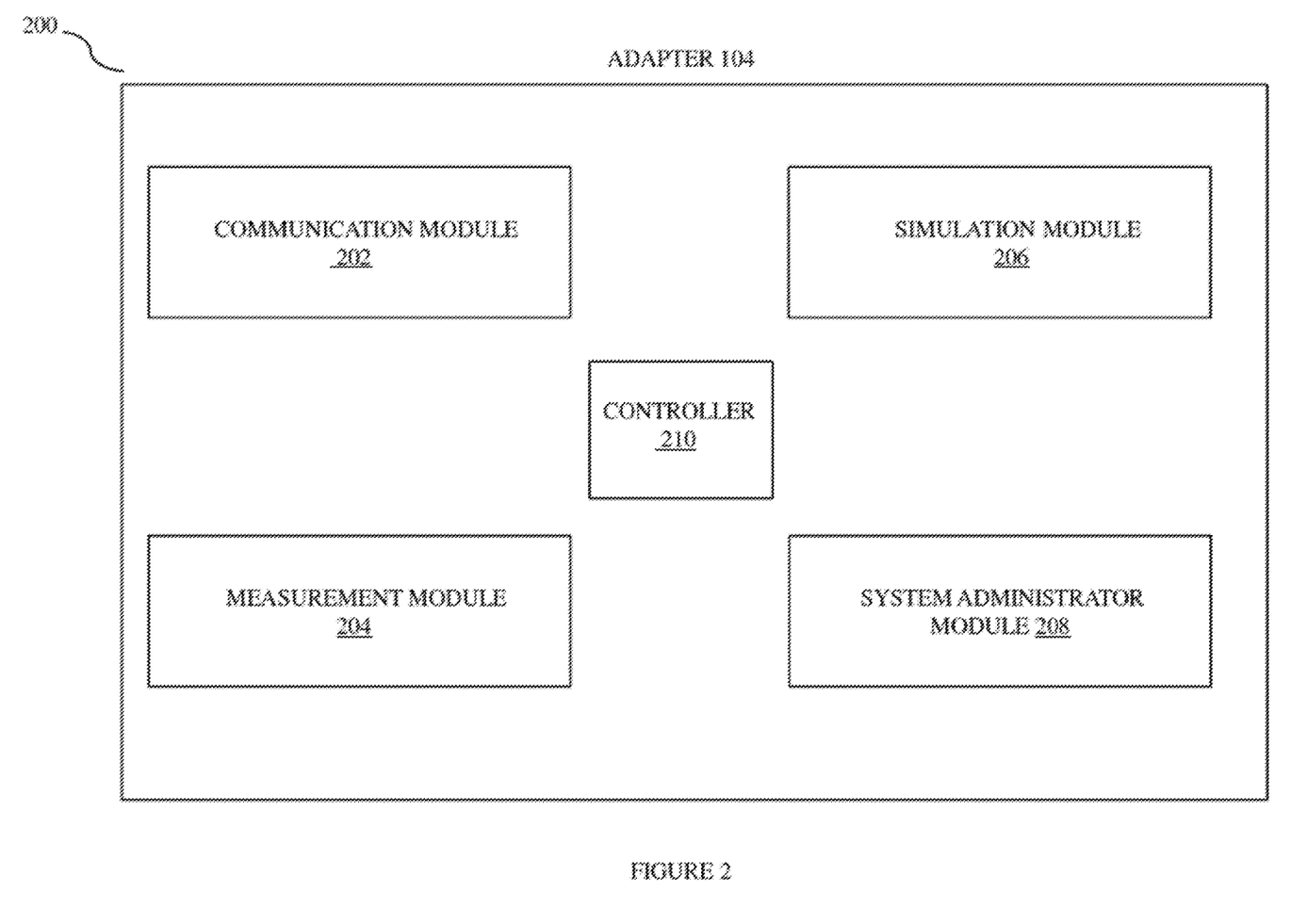
FIG. 2 is a block diagram illustrating functional components of an exemplary adapter deployed in the verification device of FIG. 1, according to an embodiment of the present disclosure.

FIG. 2 is a block diagram 200 illustrating components of the adapter 104 deployed in the verification device 102 of FIG. 1, according to an embodiment of the present disclosure. In particular, FIG. 2 illustrates a communication module 202, measurement module 204, a simulation module 206, a system administrator module 208, and a controller 210. Each component is described in further details below.

In one embodiment, the adapter 104 comprises the communication module 202 configured to operatively connect the verification device 102 of FIG. 1 to a field device (110) under verification. For example, the adapter 104 is configured to electrically connect the verification device 102 to the field device (110) under verification via USB, Bluetooth, a cable, or combinations thereof. In one embodiment, the adapter 104 is configured to communicate with the field devices (110) installed in the field.

The adapter 104 comprises the simulation module 206 configured for providing electrical excitation such as current, voltage and pulse for simulation of one or more operations in the field device under test. In one exemplary embodiment, for verification of the magnetic flow meter (field device 110) an electrical excitation simulating an actual flow or process comparisons under flowing conditions may be applied on the field device under test. The simulation module 206 is configured for providing current, voltage and pulse simulation based on the type of field device 110 based on the corresponding verification definition data set associated with the field device. The verification definition data set comprises the one or more values of the electrical excitation to be applied to the field device for simulation of process flow conditions.

In an embodiment, the adapter 104 also comprises a system administrator module 208. The system administrator module 208 comprises a memory which is used for storing the measured values of one or more parameters of the field device (110) under verification. In addition, the system administrator module 208 comprises battery and power management capability that enables the electrical excitation of for simulation based testing of field devices (110).

Figure 3:
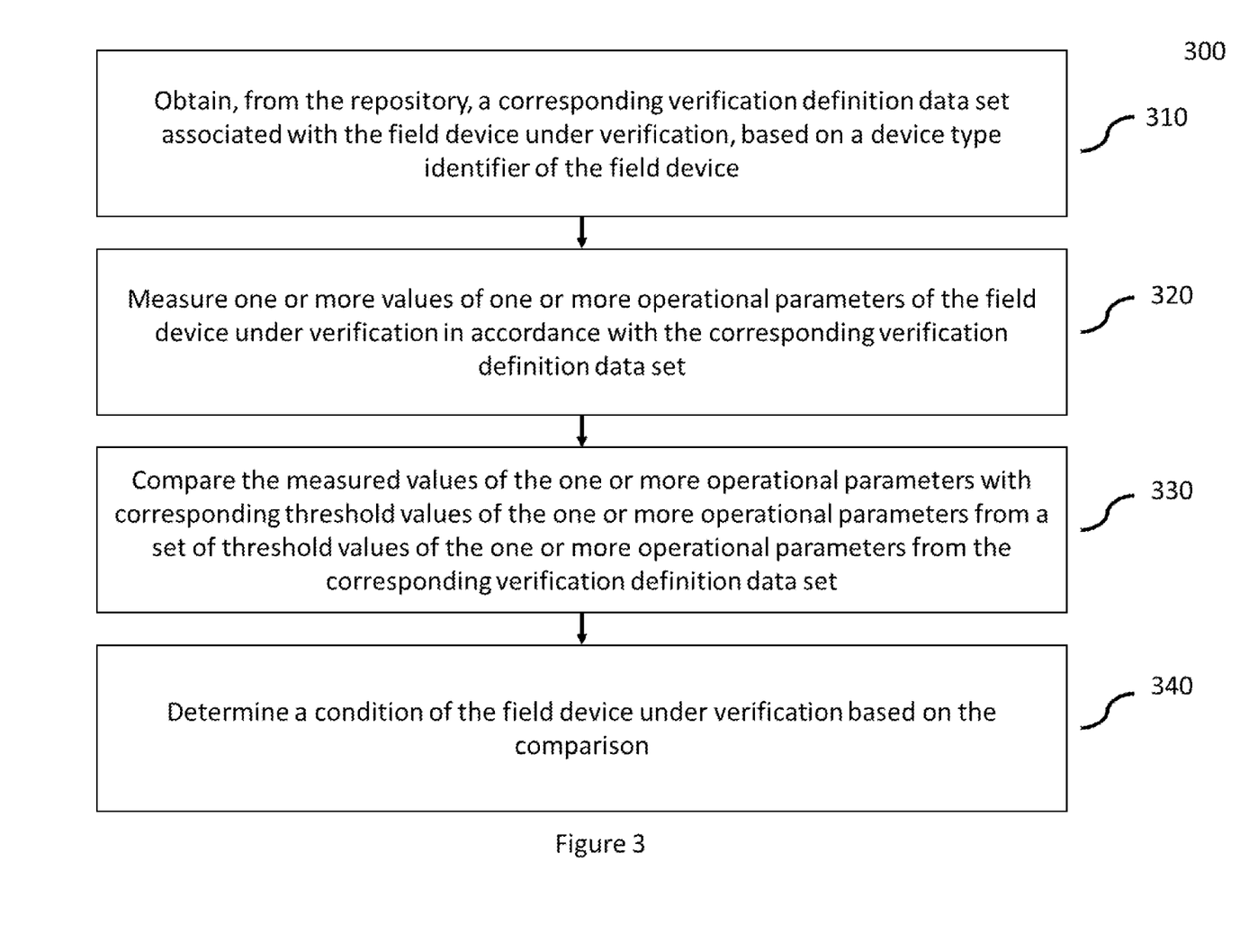
FIG. 3 is a flow chart illustrating a method for verifying in situ a plurality of types of installed field devices.

FIG. 3 is a flow chart illustrating a method 300 for verifying in situ a plurality of types of installed field devices. At step 310, a verification definition data set associated with the field device under verification are retrieved/obtained based on the device type identifier of the field device under verification. At step 320, one or more operational parameters of the field device under verification are measured in accordance with the retrieved verification definition data set. At step 330, the measured values are compared with the threshold values of the one or more operational parameters of the field device under verification, provided in the corresponding verification definition dataset. At step 340, the condition of the field device under verification is determined based on the comparison.

Figure 4:
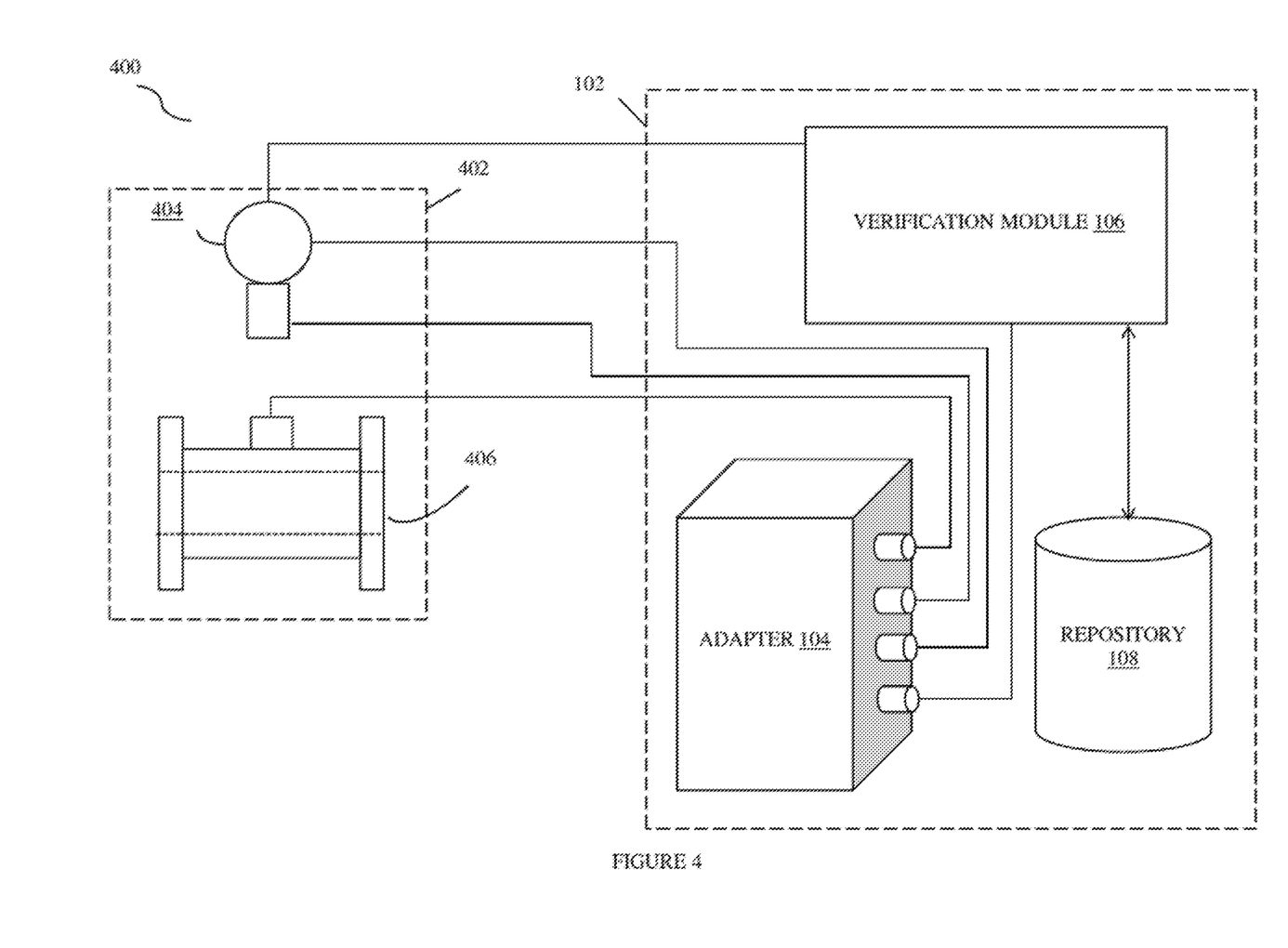
FIG. 4 illustrates an exemplary implementation of a verification device for verifying an electromagnetic flow meter, according to an embodiment of the present disclosure.

FIG. 4 illustrates an exemplary implementation 400 of a verification device for verifying an electromagnetic flow meter, according an embodiment of the present disclosure. In particular, Generally, the electromagnetic flow meter 402 comprises a set of field coils and electrodes, wherein a current is applied to the set of field coils mounted within the meter body to generate a magnetic field. When a conductive medium passes through the magnetic field, a voltage proportional to the velocity of the medium and the magnetic field density, is generated across the electrodes. The voltage is measured by the set of electrodes mounted within the meter body and sent to a transmitter 404 which calculates flow rate. Such flow meters (402) are used in variety of applications where accurate flow measurements are critical. However, regular verification of such flow meters is important to assure that the flow meter measurements are accurate with respect to specifications of the flow meter.

In the illustrated FIG. 4 the verification device 102 comprises the adapter 104 and the verification module 106. The verification device 102 is connected to the flow meter 402. In one implementation, the adapter 104 is connected to sensor assembly 406 of the flow meter 402 and to the transmitter 404 of the flow meter 402. Similarly, the verification module 106 is operatively connected to transmitter 404 of the flow meter 402.

The verification module 106 retrieves verification definition data set associated with the magnetic flow meter 402 under verification from the repository 108 of FIG. 1, wherein the verification definition data set comprises threshold values of the one or more parameters (device fingerprint data). During verification, the adapter 104 along with the verification module 106 measures values of one or more operational parameters of the one more components of the sensor based on the operation parameters specified in the verification definition data set. The one or more operational parameters may comprise but not limited to field coil resistance, field coil reactance, field coil isolation, electrode impedance and electrode isolation. The measured values are used by the verification module 106. The verification module 106 compares the measured one or more values of the one or more parameters with the threshold values of the one or more parameters and based on the comparison, determines the condition of the field device including component drift, component failure, and the like.

In one embodiment of the present disclosure, the adapter 104 is configured to electrically excite the transmitter 404 by applying voltage (also referred to as simulation voltage or current) across the transmitter 404 of the flow meter 402 to measure the transmitter (404) stability and transmitter signal conversion accuracy. The term "simulation voltage" represents a voltage similar to the voltage generated by the set of electrodes during actual flow of conductive medium, however, the simulation voltage is generated by the adapter 104 and fed to the transmitter 404 during verification to measure the transmitter stability and transmitter signal conversion accuracy. Then, the verification module 106 compares the output of the transmitter 404 representing flow rate with the expected value of the flow rate as provided in the corresponding verification definition data set, to determine transmitter or conversion errors, transmitter signal conversion accuracy, and the like.

Further, various other parameters and associated values, for example, transmitter current output, transmitter control signal to the sensor assembly 406 and transmitter pulse output may be measured and verified using the adapter 104 and the verification module 106. Hence, the verification device 102 may perform in situ verification of both of the sensor assembly 406 and the transmitter 404.

Figure 5:
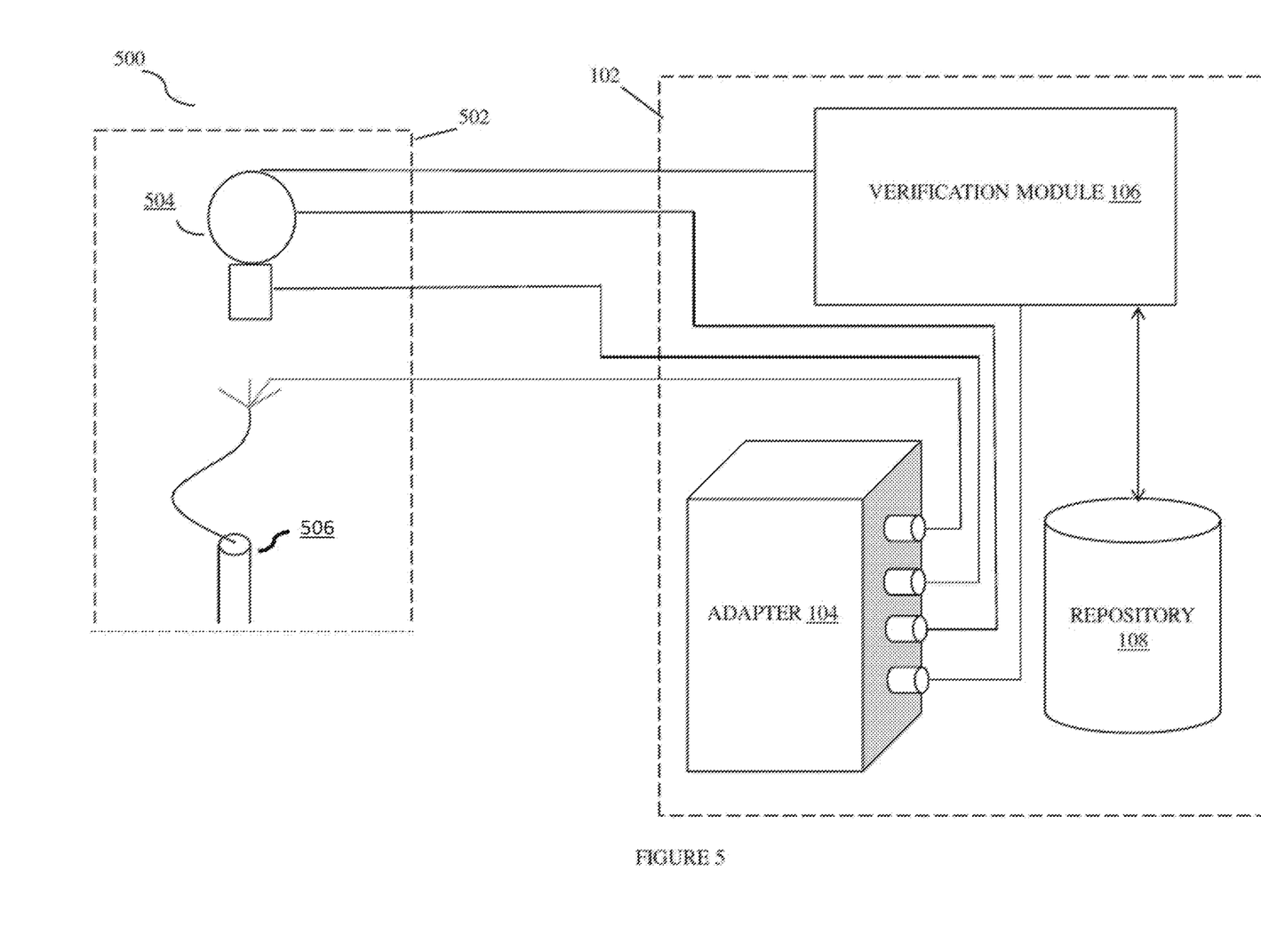
FIG. 5 illustrates another exemplary implementation of verification device for verifying a pH meter, according to an embodiment of the present disclosure.

FIG. 5 illustrates another exemplary implementation 500 of verification device for verifying a pH meter, according an embodiment of the present disclosure. In particular, FIG. 5 illustrates an exemplary field device (110) such as pH meter 502 connected to the verification device 102. Generally, the pH meter comprises a glass electrode and a reference electrode configured to measure the hydrogen-ion concentration (pH) in a solution, indicating acidity or alkalinity (also referred to a pH sensor 506. Such pH meters are used in variety of applications such as water pH level monitoring, power plant coolant monitoring, sediment analysis, and the like. However, regular verification is important to assure that the pH meter measurements are accurate with respect to specifications of the pH sensor.

In one implementation, the adapter 104 is connected to output terminal of the pH sensor 506 and to the transmitter 504 of the pH meter 502. The verification module 106 is operatively connected to transmitter 504 and sensor 506 of the pH meter 502, via the adaptor 104.

The verification module 106 retrieves verification definition data set associated with the pH meter 502 under verification from the repository 108 of FIG. 1, wherein the verification definition data set comprises threshold values of the one or more parameters. During verification, the adapter 104 along with the verification module 106, measures values of one or more parameters of the one more components of the pH meter 502, wherein the one or more parameters may comprise but not limited to sensor reference impedance, sensor isolation, sensor glass impedance, sensor and cable diagnostics. Then, the verification module 106 compares the measured one or more values of the one or more parameters with the threshold values of the one or more parameters and analyses the measurement to investigate component drift, component failures, and the like.

In one embodiment of the present disclosure, the adapter 104 along with the verification module 106, is configured to generate a simulation voltage (based on the verification definition data set) that is applied to the transmitter 504 of the pH meter 502 to measure the transmitter 504 stability and transmitter signal conversion accuracy. The term "simulation voltage" represents a voltage similar to the voltage generated by the pH sensor 506, however, the simulation voltage is generated by the adapter 104 and fed to the transmitter 504 during verification to measure the transmitter stability and transmitter signal conversion accuracy. Then, the verification module 106 compares the output of the transmitter 504 representing the pH level with the expected pH level (as per the verification definition data set) to determine transmitter or conversion errors, transmitter signal conversion accuracy, and the like. Hence, the verification device 102 may perform in situ verification of the pH meter 502.

In an embodiment, the repository 108 of the verification device 102 can be updated with one or more verification definition data sets to enable the verification device 102 to perform verification of new field devices.

Accordingly, the verification device 102 as disclosed herein for verifying a plurality of types of installed field devices (110) facilitates the reduction in development and maintenance cost, capital expenditure, operations expenditure for end users. Moreover, the verification device 102 as disclosed herein allows for simplicity of usage due to common look and feel and a single devices solution for all types of field devices. The common verification device 102 also allows for verification for legacy devices, and future devices, by adding new verification definition data sets for verification of the future field devices.

While specific language has been used to describe the disclosure, any limitations arising on account of the same are not intended. As would be apparent to a person skilled in the art, various working modifications may be made to the method in order to implement the inventive concept as taught herein.

We claim:

1. A verification device for verifying a plurality of different types of field devices installed in an industrial factory process plant, the verification device comprising:
   a. a communication adapter having a communications port configured to communicatively connect the verification device to a plurality of different field devices including a first type of field device and a second type of field device to receive values of one or more operational parameters measured by the plurality of field devices;
   b. a repository comprising a plurality of verification definition data sets each associated with one of the plurality of different field devices, including a first verification definition data set associated with the first type of field device and a second verification definition data set associated with the second type of field device wherein each verification definition data set comprise one or more sets of expected threshold values of one or more corresponding operational parameters for a corresponding type of field device from among the plurality of different field devices; and
   c. a comparison and verification processor configured for:
      i. receiving, as externally provided electronic data, a device type identifier that is uniquely specific to one of the first type of field device or the second type of field device;
      ii. obtaining, from the repository, one of the first verification definition data set or the second verification definition data as is associated with a type of field device under verification from among the plurality of different field devices, based on the device type identifier of the field device under verification;
      iii. measuring one or more values of one or more operational parameters received from the field device under verification as defined by the first verification definition data set or the second verification definition data set as obtained;
      iv. comparing the measured values of the one or more operational parameters with corresponding threshold values of the one or more operational parameters from the first verification definition data set or the second verification definition data set as obtained for the corresponding field device under verification, wherein the corresponding threshold values for the corresponding definition data set comprises a first set of threshold values and a second set of threshold values of the corresponding operational parameters, wherein the threshold values of the first set are based on reference values of the operational parameters at the production of the field device, and the second set are based on the operational parameters measured upon installation of the field device under verification in the industrial factory process plant; and
      v. determining a condition of the field device under verification from among the plurality of different field devices based on the comparison.

2. The verification device as claimed in claim 1, wherein the first verification definition data set and the second verification definition data set further comprise one or more values of electrical excitation parameters to be applied to a corresponding type of field device, and wherein the communication adaptor includes a simulator that is configured to excite the field device under verification prior to measurement of one or more values of operational parameters of the field device under verification, by providing electrical excitation in accordance with the one or more values of the electrical excitation parameters of the corresponding verification definition data set associated with the field device under verification.

3. The verification device as claimed in claim 1, wherein the verification module is configured for updating the threshold values of the one or more operational parameters of the field device under verification.

4. A method for verifying a plurality of types of field devices installed in an industrial factory process plant, the method comprising:
   i. receiving, as externally provided electronic data, a device type identifier that is uniquely specific to one of the first type of field device or the second type of field device;
   ii. obtaining, from a repository comprising an at least a first verification definition data set associated with a first type of field device and a second verification definition data set associated with a second type of field device, a corresponding verification definition data set associated with the field device under verification, based on the device type identifier of the field device under verification;
   iii. measuring one or more values of one or more operational parameters received from the field device under verification as defined by the first verification definition data set or second verification definition data set as obtained in accordance with the device type identifier;
   iv. comparing the measured values of the one or more operational parameters with corresponding threshold values of the one or more operational parameters from the first verification definition data set or second verification definition data set for the corresponding field device under verification; and
   v. determining a condition of the field device under verification based on the comparison wherein the first verification definition data set or second verification definition data set as obtained comprises a first set of one or more threshold values of the corresponding operational parameters and a second set of one or more threshold values of the corresponding operational parameters, wherein the threshold values of the first set are based on reference values of the one or more operational parameters at the production of the field device under verification; and
      wherein the threshold values of the second set are based on one or more values of the operational parameters measured upon installation of the field device under verification at the industrial factory process plant.

5. The method as claimed in claim 4, the method further comprising providing electrical excitation to one or more components of the field device based on corresponding first or second verification definition data set associated with the field device, wherein the corresponding first or second verification definition data set comprises one or more values of electrical excitation parameters to be applied to the corresponding type of field device.

6. A verification device for verifying a plurality of different types of field devices installed in an industrial factory process plant, the verification device comprising:
   a. a communication adapter having a communications port configured to communicatively connect the verification device to a plurality of different field devices including a first type of field device and a second type of field device to receive values of one or more operational parameters measured by the plurality of field devices;
   b. a repository comprising a plurality of verification definition data sets each associated with one of the plurality of different field devices, including a first verification definition data set associated with the first type of field device and a second verification definition data set associated with the second type of field device wherein each verification definition data set comprise one or more sets of expected threshold values of one or more corresponding operational parameters for a corresponding type of field device from among the plurality of different field devices; and
   c. a comparison and verification processor configured for:
      i. receiving, as externally provided electronic data, a device type identifier that is uniquely specific to one of the plurality of the first type of field device or the second type of field device that is automatically selected to be verified;
      ii. obtaining, from the repository, one of the first verification definition data set or the second verification definition data as is associated with a type of field device under verification from among the plurality of different field devices, based on the device type identifier of the field device under verification;
      iii. measuring one or more values of one or more operational parameters received from the field device under verification as defined by the first verification definition data set or the second verification definition data set as obtained;
      iv. comparing the measured values of the one or more operational parameters with corresponding threshold values of the one or more operational parameters from the first verification definition data set or the second verification definition data set as obtained for the corresponding field device under verification, wherein the corresponding threshold values for the corresponding definition data set comprises a first set of threshold values and a second set of threshold values of the corresponding operational parameters, wherein the threshold values of the first set are based on reference values of the operation parameters at the production of the field device, and the second set are based on the operational parameter measured upon installation of the field device under verification in the industrial factory process plant; and
      v. determining a condition of the field device under verification from among the plurality of different field devices based on the comparison.

* * * * *